United States Patent [19]
Parthasarathi et al.

[11] Patent Number: 5,573,845
[45] Date of Patent: Nov. 12, 1996

[54] SUPERFICIAL COATING LAYER HAVING ACICULAR STRUCTURES FOR ELECTRICAL CONDUCTORS

[75] Inventors: Arvind Parthasarathi, North Branford; William L. Brenneman, Cheshire, both of Conn.

[73] Assignee: Olin Corporation, New Haven, Conn.

[21] Appl. No.: 352,663

[22] Filed: Dec. 9, 1994

[51] Int. Cl.$^6$ ........................................ B32B 9/00
[52] U.S. Cl. ........................ 428/306.6; 428/901; 428/220
[58] Field of Search .................................... 428/210, 220, 428/901, 306.6; 361/748; 430/284; 427/97

[56] References Cited

U.S. PATENT DOCUMENTS

| | | |
|---|---|---|
| 3,728,177 | 4/1973 | Caule . |
| 3,764,399 | 10/1973 | Caule . |
| 3,853,691 | 12/1974 | Caule . |
| 3,940,303 | 2/1976 | Caule . |
| 4,452,650 | 6/1984 | Caule . |
| 4,468,293 | 8/1984 | Polan et al. . |
| 4,500,028 | 2/1985 | Breedis et al. . |
| 4,521,469 | 6/1985 | Butt et al. . |
| 4,525,422 | 6/1985 | Butt et al. . |
| 4,533,445 | 8/1985 | Orio .......................................... 430/284 |
| 4,559,281 | 12/1985 | Derfler et al. . |
| 4,605,471 | 8/1986 | Mitchell ..................................... 427/97 |
| 4,647,315 | 3/1987 | Parthasarathi et al. . |
| 4,673,967 | 6/1987 | Hingorany . |
| 4,707,418 | 11/1987 | Takiar et al. . |
| 4,707,724 | 11/1987 | Suzuki et al. . |
| 4,888,449 | 12/1989 | Crane et al. . |
| 4,939,316 | 7/1990 | Mahulikar et al. . |
| 5,001,546 | 3/1991 | Butt . |
| 5,025,114 | 6/1991 | Braden . |
| 5,041,901 | 8/1991 | Kitano et al. . |
| 5,073,521 | 12/1991 | Braden . |
| 5,096,508 | 3/1992 | Breedis et al. . |
| 5,098,796 | 3/1992 | Lin et al. . |
| 5,122,858 | 6/1992 | Mahulikar et al. . |
| 5,134,459 | 7/1992 | Maeda et al. . |
| 5,141,702 | 8/1992 | Guenin et al. . |
| 5,192,995 | 3/1993 | Yamazaki et al. . |
| 5,213,638 | 5/1993 | Mahulikar et al. . |
| 5,252,855 | 12/1993 | Ogawa et al. . |
| 5,343,073 | 8/1994 | Parthasarathi et al. . |
| 5,402,006 | 3/1995 | O'Donley . |
| 5,422,788 | 6/1995 | Heinen et al. . |

*Primary Examiner*—Patrick Ryan
*Assistant Examiner*—Patrick Jewik
*Attorney, Agent, or Firm*—Gregory S. Rosenblatt

[57] ABSTRACT

There is provided a composite material particularly suited for electrical and electronic applications having a metallic core with a desired surface finish. An acicular superficial coating layer having an apparent thickness of less than 275 angstroms is adjacent to at least a portion of the metallic core. The superficial coating layer is removable from the metallic core without appreciable change to the metallic core surface finish.

11 Claims, 1 Drawing Sheet

SUPERFICIAL COATING LAYER HAVING ACICULAR STRUCTURES FOR ELECTRICAL CONDUCTORS

BACKGROUND OF THE INVENTION

1. Field of the Invention

This invention relates to a coating for a metallic substrate. More particularly, a transparent coating is deposited on surfaces of that substrate to improve adhesion of the substrate to a polymer resin.

2. Description of the Related Art

A tenacious bond between a metal and a polymer is desired in many electrical and electronic assemblies. As one example, an electrical connector may include a metallic jack surrounded by a molded plastic insulating sheath. As a second example, the inner leads of a metallic leadframe may be encapsulated in a polymer molding resin in the assembly of an electronic package to house an integrated circuit. In both examples, as well as other applications, delamination at the metal to polymer interface allows the ingress of moisture and other contaminants that detrimentally impacts the operating performance of the assembly.

The adhesion between a polymer resin and a metallic substrate is improved by coating the metallic substrate with a second metal that forms a more tenacious bond to the polymer resin. Suitable coatings include refractory oxide forming metals such as nickel and nickel alloys or intermetallic forming coatings such as tin on a copper substrate. These coatings, as well as others, are disclosed in U.S. Pat. No. 4,888,449 to Crane et al, which is incorporated by reference in its entirety herein.

Anodization of aluminum alloy substrates enhances the strength of a polymer bond as disclosed in U.S. Pat. No. 4,939,316 to Mahulikar et al. Other satisfactory coatings include oxidation resistant materials having a thickness of 300–5,000 angstroms as disclosed in U.S. Pat. No. 5,192,995 to Yamazaki et al.

U.S. Pat. No. 5,252,855 to Ogawa et al discloses improving the adhesion between a copper base metallic substrate and a polymer resin by anodically oxidizing the substrate to form an aggregate of acicular crystals.

The ideal coating material is transparent and does not change the cosmetic appearance of the metallic substrate. Portions of the substrate may be soldered and the coating should be either solderable or easily removed from the substrate. If the coating is removed, the surface finish of the substrate should not be changed.

Other desired properties of the coating include corrosion resistance, oxidation resistance and enhanced adhesion to the polymer. In addition, the coating should be capable of application to any metallic substrate.

None of the prior art coatings satisfy all of these requirements. There remains a need for an improved coating for metallic substrates.

SUMMARY OF THE INVENTION

Accordingly, it is an object of the invention to provide a coating for a metallic substrate that improves adhesion of the substrate to a polymer. It is a feature of the invention that the coating is superficial and may be applied to any metallic substrate. Yet another feature of the invention is that the coating is transparent and does not alter the cosmetic appearance of the substrate. Yet another feature of the invention is that the coating is removable without damaging the surface finish of the substrate.

It is an advantage of the invention that the coating enhances adhesion while providing oxidation resistance and corrosion resistance. Yet another advantage is that the coating is superficial and capable of application to any metallic substrate by conventional processes such as electrolytic deposition, electroless deposition and vapor deposition. Yet another advantage is that the coating thickness is under 275 angstroms and may be rapidly removed from the substrate facilitating soldering of the substrate. Yet another advantage is that the coating is sufficiently thin so as not to interfere with existing joining techniques such as soldering and wire bonding.

In accordance with the invention, there is provided a composite material. This composite material has a metallic core with a desired surface finish. A superficial coating layer is adjacent to at least a portion of the metallic core. This superficial coating layer has apparent thickness of less than 275 angstroms and may be removed from the metallic core without an appreciable change to the surface finish.

The above stated objects, features and advantages will become more apparent from the specification and drawings that follow.

DETAILED DESCRIPTION

A first requirement of the adhesion enhancing coatings of the invention is that the coating is essentially transparent. Manufacturers and consumers are accustomed to steel and aluminum having a silver, grey color and copper having a reddish, brown color. For commercial acceptance, the coatings of the invention do not change the color of the underlying metallic core. The coating layer has an apparent thickness of less than 275 angstroms and preferably less than 200 angstroms. More preferably, the coating layer has an apparent thickness of from about 20 angstroms to about 150 angstroms and most preferably from about 50 angstroms to about 120 angstroms.

Figure 1:
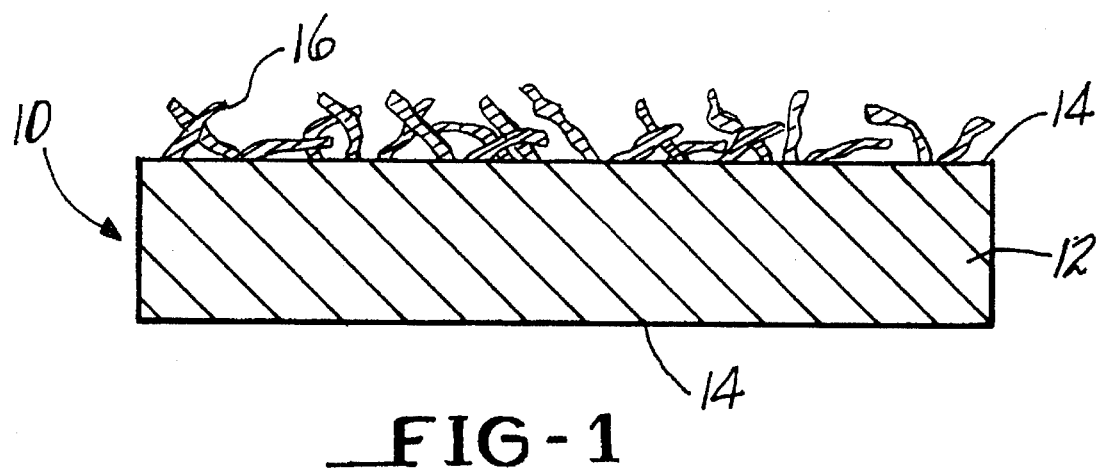
FIG. 1 shows in cross-sectional representation the composite material of the invention.

The meaning of "apparent thickness" is understood with reference to FIG. 1. FIG. 1 illustrates in cross-sectional representation a composite material 10 in accordance with the invention. The composite material 10 includes a metallic core 12 formed from any desired metal or metal alloy. For electrical and electronic applications, the metallic core is usually copper, aluminum, iron, nickel or alloys thereof. Typically, the metallic core 12 is copper or a copper base alloy.

The metallic core 12 has exposed surfaces 14 having a desired surface finish. This surface finish may be polished to a mirror finish or chemically or mechanically treated to enhance surface roughness, or any surface finish therebetween. For example, a copper foil may have electrolytically deposited macroscopic, on the order of 1 micron, dendrites on the surface as disclosed in U.S. Pat. No. 4,468,293 to Polan et al. The transparent coating of the invention is then deposited over the desired surface finish.

The coating layer of the invention is preferably formed from a plurality of needle-like acicular structures 16. When observed perpendicular to the surface 14, there are, on average, from about 25 to about 1000 of the acicular structures 16 per square micron and preferably, the average density is from about 50 to about 500 of the acicular structures per square micron.

The average length of each acicular structure is from about 0.01 micron to about 1 micron and preferably, the average length is from about 0.05 to about 0.5 microns. The preferred aspect ratio, length to diameter, is from about 3:1 to about 8:1 and more preferably from about 4:1 to about 6:1.

Most of the acicular structures 16 do not extend perpendicularly from the surface 14, rather, extend from the surface 14 at a variety of angles, forming an interwoven mesh. A polymer flowing into the voids between individual acicular structures 16 follows a tortuous path along the interstices. On solidification, the polymer is mechanically locked in place.

To maintain the transparent characteristics of the coating layer, the apparent thickness of the coating layer is less than 275 angstroms, and preferably less than 200 angstroms, as measured by Auger spectroscopy or ESCA (Electron Spectroscopy for Chemical Analysis). These techniques remove a desired volume of metal in a fixed time. Voids and interstices in the coating are ignored by these subtractive processes. As a result, the "apparent thickness" is the thickness the metal would have if all voids and interstices were absent and the coating had a density of 100% of the theoretical density of that coating material.

The "apparent thickness" is always less than the actual thickness of the coating layer and when the density of acicular structures 16 is low, there is a significant disparity between the actual thickness and the apparent thickness. However, for the transparency requirements of the invention, the apparent thickness is determinative.

The coating layer imparts oxidation resistance at temperatures at which the composite material may be exposed during storage, processing or use. These temperatures are typically up to about 250° C. While the coating layer has discontinuous voids and interstices, none extend completely through the coating layer or an oxidation site results.

In addition to oxidation resistance, the coating layer provides corrosion resistance to dilute concentrations of chlorides, sulfides and other contaminants found in an industrial environment or on the fingers of an operator.

The coating layer also enhances adhesion of the substrate to a polymer. The acicular structure enhances mechanical locking of the polymer adhesive. The coating layer is firmly bonded to the metallic substrate and not prone to separation at either the interface between the metallic substrate and the coating layer or within the coating layer itself as is typical with copper oxide coatings.

The metallic core is frequently coated with a polymer resin over a first portion of the core and a second portion of the core is bonded to another metallic structure by soldering. For example, with a leadframe, the inner lead ends are encapsulated in a polymer molding resin while the outer lead ends are soldered to bonding pads on a printed circuit board. Since the coating composition frequently inhibits soldering or contributes to the formation of embrittling intermetallics in the solder, the coating layer should be easily removed from desired portions of the metallic core. By easily removed, it is desired that the coating layer can be removed by immersion in a dilute acid such as 5% by volume sulfuric acid or 4% by weight hydrochloric acid or by immersion in a dilute alkaline solutions, such as an aqueous solution containing 10% by weight sodium hydroxide. For commercial reasons, the immersion time is short, on the order of from about 1 to about 10 seconds and preferably on the order of from about 3 to about 6 seconds.

The coating layer can be made sufficiently thin as to not interfere with soldering, wire bonding and other joining processes. In this embodiment, it is not necessary to remove the coating layer before performing the joining operation.

Removal of the coating layer should not damage the surface finish of the underlying metallic substrate. The coating layer is superficial, limited to the surface of the substrate, as opposed to an in situ coating formed from the constituents of the underlying substrate.

The superficial coating layer of the invention is deposited by any suitable means such as electrolytic deposition, electroless deposition or vapor deposition. However, while the superficial coating layer is bonded to the surface 14 of the metallic core 12, diffusion across the interface between the metallic core and the superficial coating layer is limited so that removal of the superficial coating layer does not appreciably change the surface finish of the metallic core.

The coating layer is superficial, as opposed to formed in situ, and may therefore be formed on any suitable metallic substrate. The same coating layer may be applied to an iron base, a copper base, an aluminum base or any other metal base substrate.

While any coating material meeting the above requirements is suitable, two suitable coatings are mixtures of chromium and a phosphate as disclosed in U.S. Pat. No. 4,647,315 to Parthasarathi et al and mixtures of chromium and zinc as disclosed in U.S. Pat. No. 5,343,073 to Parthasarathi et al., both of which are incorporated by reference in their entireties herein.

While the superficial coating layer has been disclosed as being deposited on a metallic core, it is within the scope of the invention to deposit the superficial coating layer on an intermediate coating layer such as nickel, silver, a palladium-nickel alloy or a nickel-tin alloy. The superficial coating layer may then be removed from selected portions to expose an intermediate layer such as silver to enhance wire bonding.

The advantages of the superficial coating of the invention will become more apparent from the examples that follow.

EXAMPLES

Example 1

A copper alloy C194 (nominal composition by weight 2.35% iron, 0.12% zinc, 0.03% phosphorous and the balance copper) strip was coated with a mixture of zinc oxide and chromium oxide having an apparent thickness of less than 100 angstroms. The superficial coating layer was electrolytically deposited from an aqueous solution containing 15 grams per liter sodium hydroxide, 1 gram per liter zinc in the form of zinc oxide and 0.5 grams per liter chromium in the form of sodium dichromate. The electrolyte was heated to 60° C. and an electric current was impressed across the plating bath, utilizing the copper alloy C194 strip as the cathode. A current density of 15 mA/cm$^2$ was applied for 10 seconds to deposit the coating.

Figure 2:
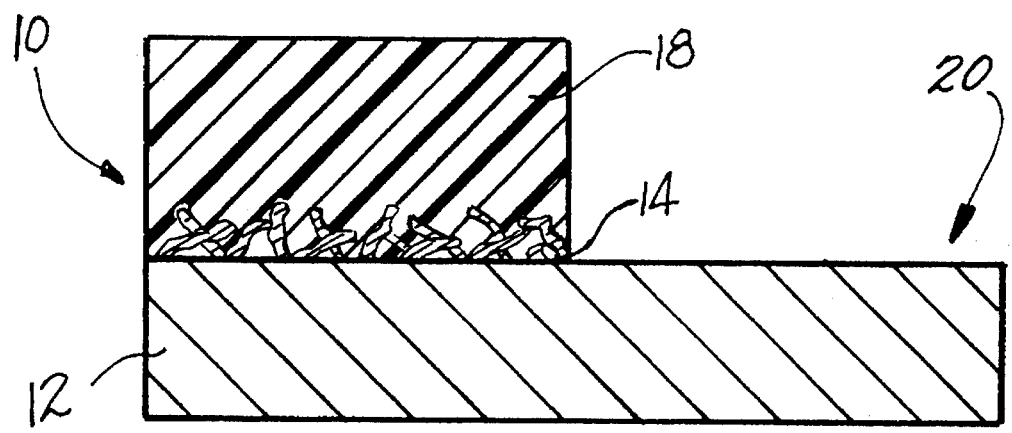
FIG. 2 shows in cross-sectional representation the composite material of FIG. 1 with a portion bonded to a polymer resin.

With reference to FIG. 2, at a magnification of 25,000×, an acicular structure 16 was observed on the surface 14 of the copper alloy C194 core 12.

When the coating was heated in air to 175° C. and held at temperature for 90 minutes, no oxidation of the underlying metallic core was visible.

An epoxy molding resin 18 was applied over a first portion of the composite material 10. A shear stress of 1,250 psi was required to separate the epoxy molding resin 18 from the composite material 10. Immersion of a second portion 20 into 5% by volume sulfuric acid for 5 seconds removed all of the acicular structure without changing the surface finish of the metallic core.

Example 2

A coating layer in the form of a mixture of zinc oxide and chromium oxide was electrolytically deposited by the process disclosed in Example 1 except that the concentration of sodium hydroxide in the electrolyte was 20 grams per liter. Rather than an acicular structure, nodules having an aspect ratio of approximately 1:1 were formed on the surface of the copper alloy C194 metallic core. While the nodular coating provided oxidation resistance and was readily removed by immersion in 5% by volume sulfuric acid, when an epoxy molding resin was applied over the nodular surface, a shear strength of only 250 psi was required to separate the molding resin from the metallic core.

It is apparent that there has been provided in accordance with this invention a superficial coating layer for a metallic core that fully satisfies the objects, means and advantages set forth herein before. While the invention has been described in combination with specificate embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electrical assembly, comprising:

an electrical conductor having a metallic core with a desired surface finish and an essentially transparent superficial coating layer in the form of a plurality of acicular structures having an average length of from about 0.01 micron to about 1 micron and a length to diameter aspect ratio of from about 3:1 to about 8:1, said superficial coating layer having an apparent thickness, which is defined as the thickness of the metal if all voids and interstices were absent and the coating had a density of 100% of the theoretical density of that coating material, of less than 275 angstroms adjacent to at least a first portion of said metallic core and said superficial coating layer is removable from said metallic core without appreciable change to said surface finish; and a polymer bonded to said first portion and mechanically locked to said superficial coating layer.

2. The electrical assembly of claim 1 wherein the density of said plurality of acicular structures is from about 25 structures per square micron to about 1000 structures per square micron.

3. The electrical assembly of claim 2 wherein said metallic core is selected from the group consisting of copper, aluminum, iron, nickel and alloys thereof.

4. The electrical assembly of claim 3 wherein said surface finish is roughened by the presence of macroscopic dendrites.

5. The electrical assembly of claim 3 wherein an intervening layer is disposed between said metallic core and said superficial coating layer.

6. The electrical assembly of claim 5 wherein said intervening layer is selected from the group consisting of nickel, silver, palladium-nickel alloys and nickel-tin alloys.

7. The electrical assembly of claim 3 wherein said superficial coating layer covers said first portion of said metallic core and said desired surface finish is exposed at a second portion of said core.

8. The electrical assembly of claim 3 wherein a second portion of said metallic core is free of said superficial coating layer.

9. The electrical assembly of claim 8 wherein said second portion is coated with solder.

10. The electrical assembly of claim 8 wherein said electrical assembly is a leadframe.

11. The electrical assembly of claim 8 wherein said electrical assembly is a connector.

* * * * *